US012613163B2

(12) United States Patent
Tao et al.

(10) Patent No.: US 12,613,163 B2
(45) Date of Patent: Apr. 28, 2026

(54) SYSTEM AND METHOD FOR TESTING TWO-PHASE LIQUID COOLING

(71) Applicants: ZTE CORPORATION, Shenzhen (CN); INSTITUTE OF SPACECRAFT SYSTEM ENGINEERING, Beijing (CN)

(72) Inventors: Cheng Tao, Shenzhen (CN); Yalong Wang, Beijing (CN); Fan Liu, Shenzhen (CN); Xiaodong Zhou, Shenzhen (CN); Shuai Li, Shenzhen (CN); Xingang Yu, Beijing (CN)

(73) Assignees: ZTE CORPORATION, Shenzhen (CN); INSTITUTE OF SPACECRAFT SYSTEM ENGINEERING, Beijing (CN)

( * ) Notice: Subject to any disclaimer, the term of this patent is extended or adjusted under 35 U.S.C. 154(b) by 314 days.

(21) Appl. No.: 18/688,011

(22) PCT Filed: Mar. 2, 2022

(86) PCT No.: PCT/CN2022/078912
§ 371 (c)(1),
(2) Date: Feb. 29, 2024

(87) PCT Pub. No.: WO2023/029419
PCT Pub. Date: Mar. 9, 2023

(65) Prior Publication Data
US 2024/0377284 A1 Nov. 14, 2024

(30) Foreign Application Priority Data
Sep. 1, 2021 (CN) .......................... 202111017904.1

(51) Int. Cl.
G01M 99/00 (2011.01)
H05K 7/20 (2006.01)

(52) U.S. Cl.
CPC ...... G01M 99/002 (2013.01); H05K 7/20318 (2013.01); H05K 7/20327 (2013.01)

(58) Field of Classification Search
CPC ............ G01M 99/002; H05K 7/20318; H05K 7/20327
See application file for complete search history.

(56) References Cited

U.S. PATENT DOCUMENTS

2014/0245769 A1* 9/2014 Vandermeulen ...... F24F 3/1417
62/238.3

FOREIGN PATENT DOCUMENTS

CN 204267120 U 4/2015
CN 104676248 A 6/2015
(Continued)

OTHER PUBLICATIONS

International Searching Authority. International Search Report and Written Opinion for PCT Application No. PCT/CN2022/078912 and English translation, mailed May 23, 2022, pp. 1-12.
(Continued)

*Primary Examiner* — Jonathan M Dunlap
(74) *Attorney, Agent, or Firm* — Vivacqua Crane, PLLC

(57) ABSTRACT

A system and method for testing two-phase liquid cooling are disclosed. The system may include, a liquid storage tank; a power pump having an inlet in communication with an outlet of the liquid storage tank; a regenerator having a first loop and a second loop and a first regulating valve; a preheater and a second regulating valve; a liquid outlet port and a liquid outlet valve; a liquid inlet port and a liquid inlet valve; and a condenser having an inlet in communication with an outlet of the second loop.

18 Claims, 9 Drawing Sheets

1. Liquid Storage Tank
2. Power Pump
3. Regenerator
31: First Loop
32: Second Loop
4. Preheater
5. Liquid Outlet Port
6. Liquid Inlet Port
7. Condenser
8. Flowmeter
OUT: Object Under Test
10. Vacuum Pump
11. Recycling/Filling Port
T0, T1, T2, T3, T4,T5: Thermometers
P1, P2: Press Gauges
K1: First Regulating Valve
K2: Second Regulating Valve
K3: Liquid Outlet Valve
K5: Liquid Inlet Valve
K9: Control Valve
9. Sight Glass

(56)                    References Cited

FOREIGN PATENT DOCUMENTS

| | | | |
|---|---|---|---|
| CN | 106569524 | A | 4/2017 |
| CN | 107027267 | A | 8/2017 |
| CN | 108894834 | A | 11/2018 |
| CN | 110736551 | A | 1/2020 |
| CN | 111200922 | A | 5/2020 |
| CN | 111575043 | A | 8/2020 |
| CN | 112292004 | A | 1/2021 |
| CN | 112304655 | A | 2/2021 |
| CN | 112325495 | A | 2/2021 |
| CN | 212538353 | U | 2/2021 |
| CN | 112924487 | A | 6/2021 |
| CN | 113013120 | A | 6/2021 |
| CN | 113473822 | A | 10/2021 |
| IL | 107376 | A | 6/1998 |
| WO | 2018227976 | A1 | 12/2018 |

OTHER PUBLICATIONS

The State Intellectual Property Office of People's Republic of China. First Office Action for CN Application No. 202111017904.1 and English translation, mailed Jun. 2021, pp. 1-7.

The State Intellectual Property Office of People's Republic of China. First Search Report for CN Application No. 202111017904.1 and English translation, mailed Oct. 7, 2021, pp. 1-5.

The State Intellectual Property Office of People's Republic of China. Supplementary Search Report for CN Application No. 202111017904.1 and English translation, mailed Oct. 24, 2021, pp. 1-5.

European Patent Office. Partial Supplementary European Search Report for EP Application No. 22862568.7, mailed Dec. 2, 2024, pp. 1-10.

* cited by examiner

1. Liquid Storage Tank
2: Power Pump
3. Regenerator
31: First Loop
32: Second Loop
4. Preheater
5. Liquid Outlet Port
6. Liquid Inlet Port
7. Condenser
8. Flowmeter
OUT: Object Under Test 10. Vacuum Pump
11. Recycling/Filling Port
T0, T1, T2, T3, T4,T5: Thermometers
P1, P2: Press Gauges
K1: First Regulating Valve
K2: Second Regulating Valve
K3: Liquid Outlet Valve
K5: Liquid Inlet Valve
K9: Control Valve
 9. Sight Glass

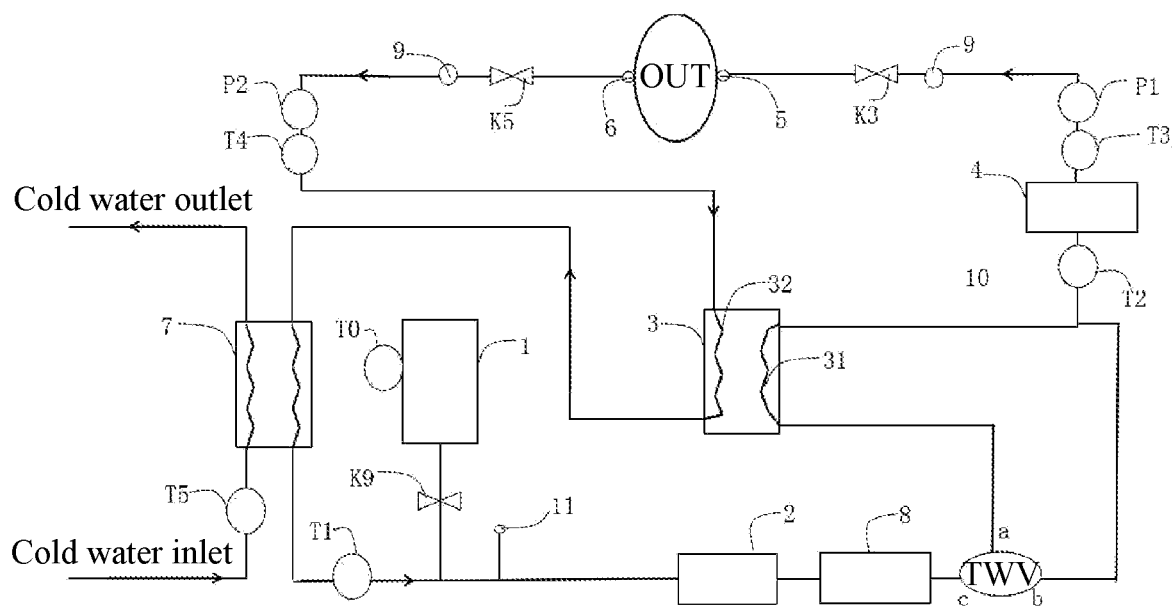

1. Liquid Storage Tank
2: Power Pump
3. Regenerator
31: First Loop
32: Second Loop
4. Preheater
5. Liquid Outlet Port
6. Liquid Inlet Port
7. Condenser
K9: Control Valve
OUT: Object Under Test
a, b, c:valve 10. Vacuum Pump
11. Recycling/Filling Port
T0, T1, T2, T3, T4,T5: Thermometers
P1, P2: Press Gauges
K1: First Regulating Valve
K2: Second Regulating Valve
K3: Liquid Outlet Valve
K5: Liquid Inlet Valve
8. Flowmeter
9. Sight Glass
TWV: Three Way Valve

FIG. 2

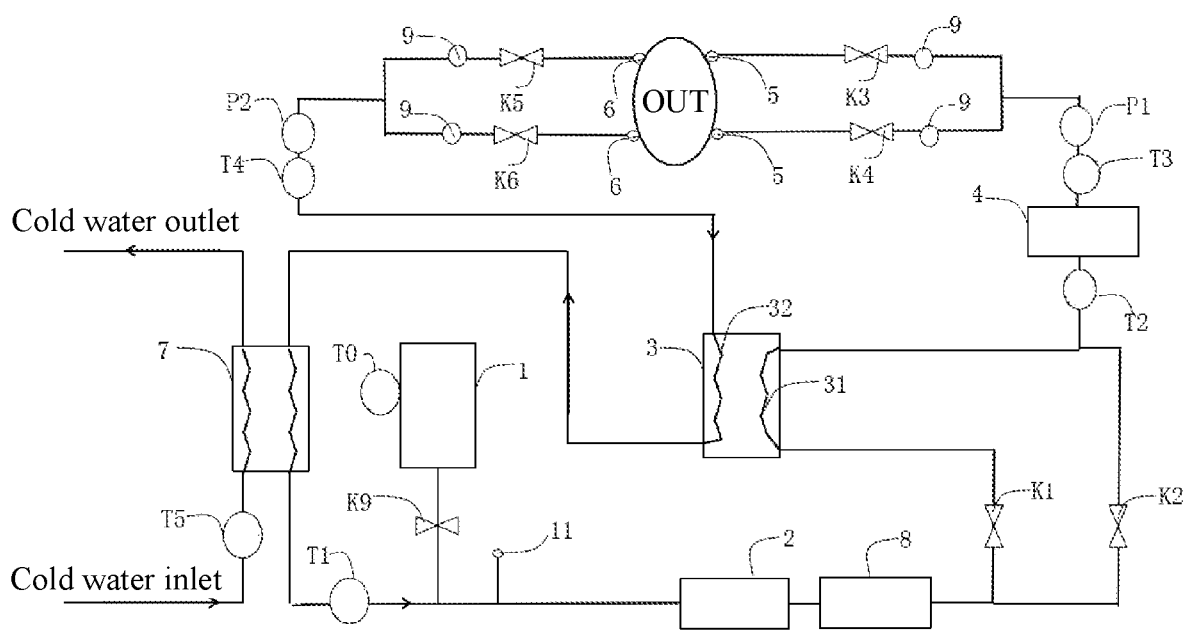

Cold water outlet

Cold water inlet

1. Liquid Storage Tank
2: Power Pump
3. Regenerator
31: First Loop
32: Second Loop
4. Preheater
5. Liquid Outlet Port
6. Liquid Inlet Port
7. Condenser
8. Flowmeter 9. Sight Glass
11. Recycling/Filling Port
T0, T1, T2, T3, T4,T5: Thermometers
P1, P2: Press Gauges
K1: First Regulating Valve
K2: Second Regulating Valve
K3, K4: Liquid Outlet Valves
K5, K6: Liquid Inlet Valves
K9: Control Valve
 OUT: Object Under Test

FIG. 3

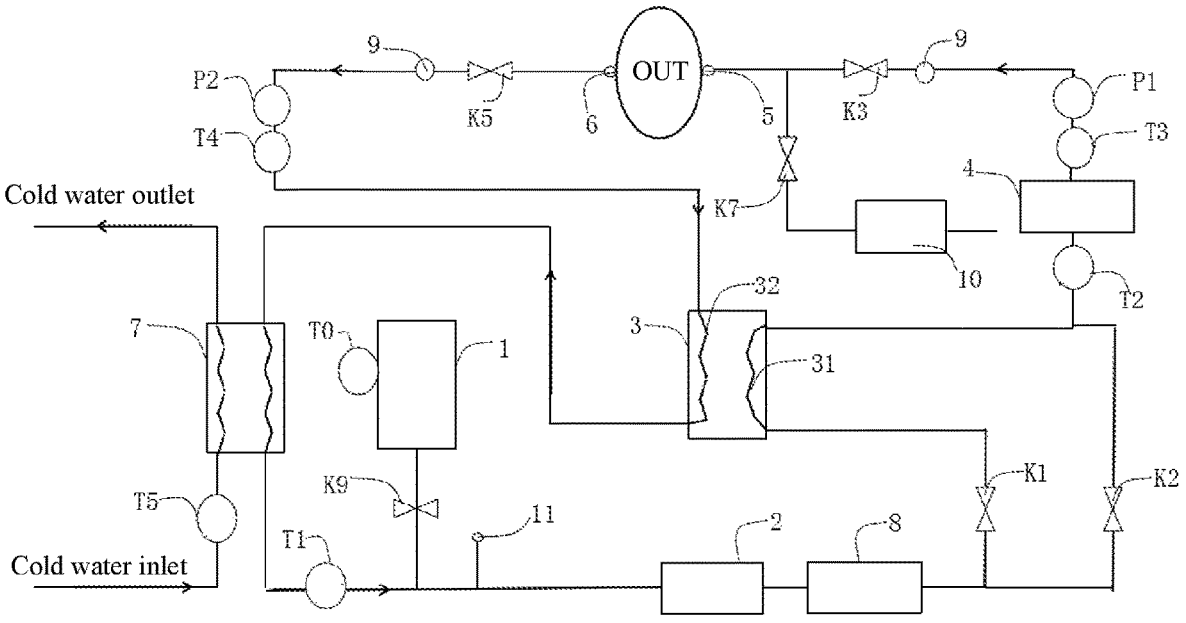

| | |
|---|---|
| 1. Liquid Storage Tank | 10. Vacuum Pump |
| 2: Power Pump | 11. Recycling/Filling Port |
| 3. Regenerator | T0, T1, T2, T3, T4,T5: Thermometers |
| 31: First Loop | P1, P2: Press Gauges |
| 32: Second Loop | K1: First Regulating Valve |
| 4. Preheater | K2: Second Regulating Valve |
| 5. Liquid Outlet Port | K3: Liquid Outlet Valve |
| 6. Liquid Inlet Port | K5: Liquid Inlet Valve |
| 7. Condenser | K7: Gas Outlet Valve |
| 8. Flowmeter | K9: Control Valve |
| 9. Sight Glass | OUT: Object Under Test |

FIG. 4

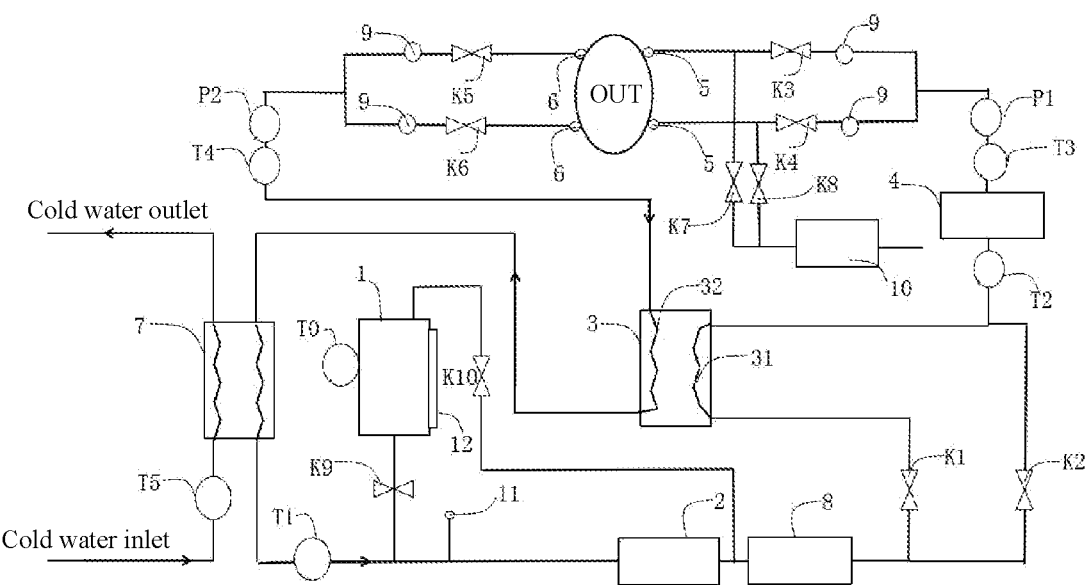

1. Liquid Storage Tank
2. Power Pump
3. Regenerator
31: First Loop
32: Second Loop
4. Preheater
5. Liquid Outlet Port
6. Liquid Inlet Port
7. Condenser
8. Flowmeter
9. Sight Glass 10. Vacuum Pump
11. Recycling/Filling Port
T0, T1, T2, T3, T4,T5: Thermometers
P1, P2: Press Gauges
K1: First Regulating Valve
K2: Second Regulating Valve
K3, K4: Liquid Outlet Valves
K5, K6: Liquid Inlet Valves
K7, K8: Gas Outlet Valves
K9: Control Valve
K10: Electromagnetic Valve
OUT: Object Under Test

FIG. 5

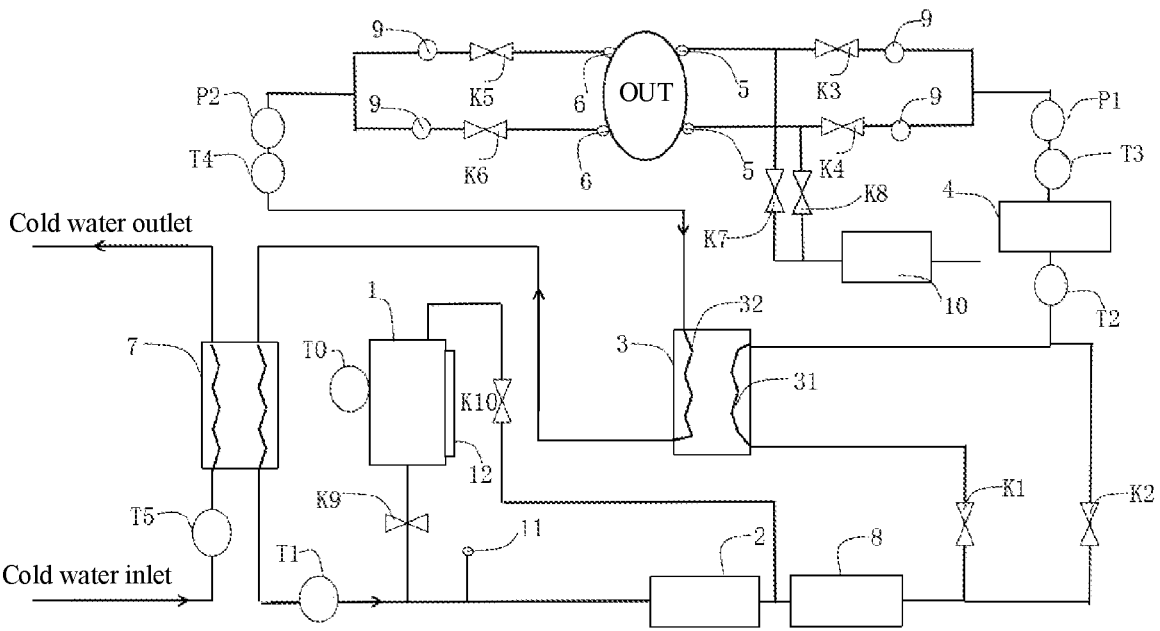

1. Liquid Storage
2: Power Pump
3. Regenerator
31: First Loop
32: Second Loop
4. Preheater
5. Liquid Outlet Port
6. Liquid Inlet Port
7. Condenser
8. Flowmeter
9. Sight Glass 10. Vacuum Pump
11. Recycling/Filling Port
T0, T1, T2, T3, T4: Thermometers
P1, P2: Press Gauges
K1: First Regulating Valve
K2: Second Regulating Valve
K3, K4: Liquid Outlet Valves
K5, K6: Liquid Inlet Valves
K7, K8: Gas Outlet Valves
K9: Control Valve
K10: Electromagnetic Valve
OUT: Object Under Test

FIG. 8

SYSTEM AND METHOD FOR TESTING TWO-PHASE LIQUID COOLING

CROSS-REFERENCE TO RELATED APPLICATION

This application is a national stage filing under 35 U.S.C. § 371 of international application number PCT/CN2022/078912, filed Mar. 2, 2022, which claims priority to Chinese patent application No. 2021110179041 filed Sep. 1, 2021. The contents of these applications are incorporated herein by reference in their entirety.

TECHNICAL FIELD

The present disclosure relates to the technical field of heat dissipation for power equipment and electronic equipment, and in particular to a system and method for testing two-phase liquid cooling.

BACKGROUND

Due to the lightweight and miniaturization requirements of the power equipment and electronic equipment, the power consumption density is greatly increased, and the single-phase liquid cooling scheme is increasingly difficult to meet the application requirements. Pump-driven two-phase cooling systems can provide a more efficient, stable and uniform heat transfer effect by means of the latent heat of evaporation and condensation of phase changeable working medium, and at the same time, it is safer to operate, smaller in size and more flexible. It is a new generation of heat dissipation technology that has attracted much attention in the field of power equipment and electronic equipment.

In the pump-driven two-phase system, the pure liquid working medium is driven by the power pump to enter the evaporator to absorb heat, then the working medium is transformed into the vapor-liquid two-phase state, and then the two-phase state working medium enters the condenser to release heat and returns to the single-phase liquid state, and the process above repeats. However, it is ineffective to accurately control the inlet liquid temperature of the working medium entering the object under test (OUT), and the energy loss of the system is large.

SUMMARY

Some embodiments of the present disclosure provide a system and a method for testing two-phase liquid cooling, which can realize accurate control of the inlet liquid temperature of the working medium entering the object under test and greatly reduce the energy loss of the system.

An embodiment of the present disclosure provides a system for testing two-phase liquid cooling, which may include a liquid storage tank configured to store a working medium;

a power pump having an inlet in communication with an outlet of the liquid storage tank;

a regenerator and a first regulating valve; where the regenerator comprises a first loop having an inlet in communication with an outlet of the power pump through the first regulating valve, and the power pump is configured to convey the working medium to the first loop;

a preheater and a second regulating valve; where an inlet of the preheater is in communication with an outlet of the first loop, and the inlet of the preheater is further in communication with the outlet of the power pump through the second regulating valve;

a liquid outlet port and a liquid outlet valve; where the liquid outlet port is configured to communicate with an object under test, and the liquid outlet port is in communication with the preheater through the liquid outlet valve;

a liquid inlet port and a liquid inlet valve; where the regenerator may further include a second loop having an inlet in communication with the liquid inlet port through the liquid inlet valve, and energy exchange is allowed between the first loop and the second loop in the regenerator; and a condenser having an inlet in communication with an outlet of the second loop; where the condenser is configured to cool the working medium passing through the object under test, and an outlet of the condenser is in communication with both an inlet of the power pump and the outlet of the liquid storage tank.

An embodiment of the present disclosure provides a method for testing two-phase liquid cooling, which is applied to the system as described above; the method may include, connecting the object under test between the liquid inlet port and the liquid outlet port;

regulating a rotating speed of the power pump, such that a flow in the system reaches a target flow;

regulating a temperature of the liquid storage tank, such that a temperature of the liquid storage tank reaches a target evaporation temperature of the object under test;

regulating a water injection temperature of the condenser, such that a difference between the temperature of the liquid storage tank and a pre-pump temperature of the power pump is greater than a pre-pump subcooled degree safety value; and regulating both the first regulating valve and the second regulating valve, such that a difference between a liquid inlet port evaporation temperature of the liquid inlet valve and a temperature at the inlet of the preheater reaches a target inlet liquid subcooled degree of the object under test.

In the system for testing two-phase liquid cooling as proposed by the present disclosure, the outlet pipeline of the power pump is split into two ways, where one way of the pipeline is directly connected to the inlet of the preheater by means of the second regulating valve, and the other way of the pipeline is connected to the inlet of the first loop of the regenerator by means of the first regulating valve; the outlet of the first loop of the regenerator is in communication with the preheater; and a liquid inlet port is in communication with the inlet of the second loop of the regenerator by means of the liquid inlet valve, the outlet of the second loop is in communication with the inlet of the condenser. Due to the liquid working medium within the first loop in the regenerator, and the gas-liquid two-phase working medium in the second loop that passes through the object under test, energy exchange would occur between the first loop and the second loop, so that the temperature of the liquid working medium in the first loop would increase and the temperature of the gas-liquid two-phase working medium in the second loop would decrease. Due to the increase in the temperature of the liquid working medium in the first loop, the first regulating valve can be regulated in use to connect or isolate the first loop of the regenerator according to the demand of the inlet liquid temperature of the object under test, and high-precision control for the inlet liquid temperature can be realized through the cooperation of the regenerator and the preheater.

Due to the increase in the temperature of the liquid working medium in the first loop, when the liquid working medium flowing through the first loop merges with the liquid working medium flowing through the second regulating valve, the overall temperature of the merged liquid working medium rises, and at this time, the energy required for the preheater to heat the liquid working medium to the target temperature decreases. Furthermore, due to the decrease in the temperature of the gas-liquid two-phase working medium flowing through the second loop, less energy is required for the condenser to cool the gas-liquid two-phase working medium into liquid. The system for testing two-phase liquid cooling in this embodiment can realize accurate control of the inlet temperature of the working medium entering the object under test, while making full use of the residual heat of the working medium in gas-liquid two-phase state passing through the object under test, thus greatly reducing the energy loss of the system.

BRIEF DESCRIPTION OF DRAWINGS

One or more embodiments are illustrated in conjunction with the corresponding drawings, which do not constitute any limitation of the embodiments.

FIG. 2 depicts a schematic diagram showing the system shown in FIG. 1 where the first regulating valve and the second regulating valve are integrated into a three-way valve;

FIG. 3 depicts a schematic diagram showing a system for testing two-phase liquid cooling according to another embodiment of the present disclosure;

FIG. 4 depicts a schematic diagram showing a system for testing two-phase liquid cooling according to yet another embodiment of the present disclosure;

FIG. 5 depicts a schematic diagram showing a system for testing two-phase liquid cooling according to yet another embodiment of the present disclosure;

FIG. 8 depicts a schematic diagram showing the system shown in FIG. 5 with an additional heater and an additional spray loop.

DETAILED DESCRIPTION

Various embodiments of the present disclosure will be described in detail below in conjunction with the drawings to illustrate the purpose, technical scheme and advantages of the present disclosure. However, it shall be appreciated by those having ordinary skill in the art that many technical details are put forward in order to clarify the present disclosure. However, the technical solutions claimed in the present disclosure can be practiced even without these technical details and various alternations and modifications based on the following embodiments. The following embodiments are divided for the convenience of description, and should not constitute any limitation on the implementation of the present disclosure. The embodiments can be combined with and based on each other without conflict.

Figure 1:
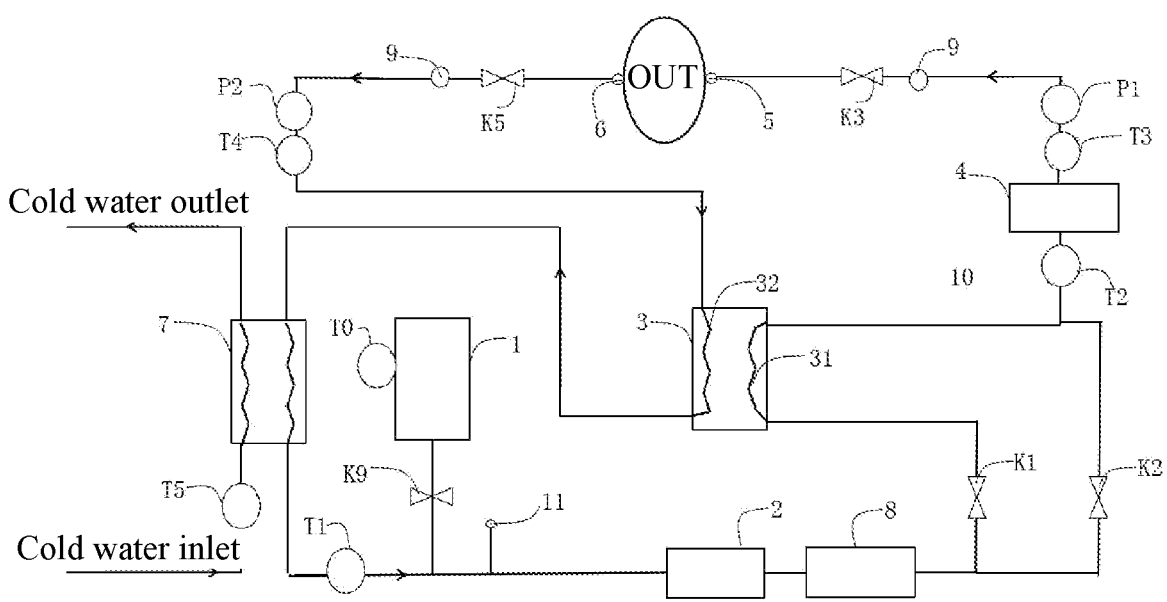
FIG. 1 depicts a schematic diagram showing a system for testing two-phase liquid cooling according to an embodiment of the present disclosure.

FIG. 1 depicts a system for testing two-phase liquid cooling according to an embodiment. As shown in FIG. 1, the system includes, a liquid storage tank 1, a power pump 2, a regenerator 3, a first regulating valve K1, a preheater 4, a second regulating valve K2, a liquid outlet port 5, a liquid outlet valve K3, a liquid inlet port 6, a liquid inlet valve K5, and a condenser 7. The liquid storage tank 1 is configured to store a working medium. The power pump 2 has an inlet in communication with an outlet of the liquid storage tank 1. The regenerator 3 includes a first loop 31 that has an inlet in communication with an outlet of the power pump 2 through the first regulating valve K1. The power pump 2 is configured to convey the working medium to the first loop 31. The preheater 4 has an inlet in communication with an outlet of the first loop 31. The inlet of the preheater 4 is further in communication with the outlet of the power pump 2 through the second regulating valve K2. The liquid outlet port 5 is configured to communicate with an object under test, and to communicate with the preheater 4 through the liquid outlet valve K3. The regenerator 3 further includes a second loop 32 that has an inlet in communication with the liquid inlet port 6 through the liquid inlet valve K5. Energy exchange occurs between the first loop 31 and the second loop 32 in the regenerator 3. The condenser 7 has an inlet in communication with an outlet of the second loop 32, and is configured to cool the working medium passing through the object under test. The condenser 7 has an outlet in communication with the inlet of the power pump 2 and the outlet of the liquid storage tank 1.

The structure of the system for testing two-phase liquid cooling is described below.

The outlet of the liquid storage tank 1 communicates with the pipeline between the condenser 7 and the power pump 2, and the outlet of the liquid storage tank 1 communicates with the inlet of the power pump 2. The outlet pipeline of the power pump 2 is split into two ways. One way of pipeline is directly connected to the inlet of the preheater 4 through the second regulating valve K2, and the other way of pipeline is connected to the inlet of the first loop 31 of the regenerator 3 through the first regulating valve K1. The outlet of the first loop 31 of the regenerator 3 communicates with the preheater 4. The outlet of the preheater 4 communicates with the liquid outlet port 5 through the liquid outlet valve K3. The liquid inlet port 6 communicates with the inlet of the second loop 32 of the regenerator 3 through the liquid inlet valve K5. The outlet of the second loop 32 communicates with the inlet of the condenser 7. The outlet of the condenser 7 communicates with the inlet of the power pump 2. It is worth noting that it does not explicitly describe how the communication between the components is realized. It can be understood that the communication in this embodiment is realized through pipelines or pipes to realize the flow and circulation of the working medium in the system. The object under test which is tested by the above system for testing two-phase liquid cooling can be a cold plate, a quick disconnect, a pipeline, or the like. According to the requirements of the application environment of the object under test, the parameters such as flow resistance and thermal resistance of the object under test should be tested under the specified quantity of flow, evaporation temperature, inlet liquid subcooled degree and dryness, and all the parameters should be accurately and stably controlled. The working medium in the system for testing two-phase liquid cooling can be Freon or water.

When in use, the object under test is connected between the liquid outlet port 5 and the liquid inlet port 6. When the control valve K9 of the liquid storage tank 1 is opened, the liquid working medium stored in the liquid storage tank 1 flows out to the position where the power pump 2 is located.

When the first regulating valve K1 is closed and the second regulating valve K2 is opened, the power pump 2 conveys the liquid working medium to the position where the preheater 4 is located through the pipelines connecting the second regulating valve K2. The preheater 4 heats the liquid working medium to a gas-liquid two-phase state. The working medium in the gas-liquid two-phase state flows through the object under test through the opened liquid outlet valve K3 and liquid inlet valve K5, and flows into the second loop 32 of the regenerator 3, then flows through the second loop 32 and reaches the condenser 7 where the working medium in the gas-liquid two-phase state is cooled into liquid. Then, the liquid working medium is conveyed to preheater 4 by power pump 2 to achieve cyclic testing of the working medium in the system.

When the first regulating valve K1 and the second regulating valve K2 are opened concurrently, the power pump 2 conveys the liquid working medium to the position where the preheater 4 is located through the pipelines connecting the second regulating valve K2. Meanwhile, the power pump 2 conveys the liquid working medium to the first loop 31 of the regenerator 3 through the pipelines connecting the first regulating valve K1. After that, the working medium flowing through the first loop 31 and the working medium passing through the second regulating valve K2 merge at the inlet of the preheater 4. The merged working medium enters the preheater 4 and is heated by the preheater 4 to a gas-liquid two-phase state. The working medium in the gas-liquid two-phase state flows through the object under test through the opened liquid outlet valve K3 and liquid inlet valve K5, and then flows into the second loop 32 of the regenerator 3. At this time, due to the gas-liquid two-phase working medium that flows in the second loop 32, the liquid working medium in the first loop 31 can be heated to realize the energy exchange between the first loop 31 and the second loop 32, so that the temperature of the liquid working medium in the first loop 31 increases and the temperature of the gas-liquid two-phase working medium in the second loop 32 decreases. Since the temperature of the liquid working medium in the first loop 31 rises, when the liquid working medium flowing through the first loop 31 merges with the liquid working medium flowing through the second regulating valve K2, the overall temperature of the merged liquid working medium rises, and at this time, the energy required for the preheater 4 to heat the liquid working medium to the target temperature decreases. Moreover, since both the regenerator 3 and the preheater 4 can heat the working medium flowing into the object under test, high-precision liquid inlet temperature control can be realized through the cooperation of the regenerator 3 and the preheater 4. Furthermore, due to the lowered temperature of the gas-liquid two-phase working medium flowing through the second loop 32, less energy is required for the condenser 7 to cool the gas-liquid two-phase working medium into liquid.

As a consequence, in the system for testing two-phase liquid cooling as proposed by the present disclosure, the outlet pipeline of the power pump 2 is split into two ways, where one way of the pipeline is directly connected to the inlet of the preheater 4 by means of the second regulating valve K2, and the other way of the pipeline is connected to the inlet of the first loop 31 of the regenerator 3 by means of the first regulating valve K1; the outlet of the first loop 31 of the regenerator 3 is in communication with the preheater 4; and a liquid inlet port 6 is in communication with the inlet of the second loop 32 of the regenerator 3 by means of the liquid inlet valve K5, and the outlet of the second loop 32 is in communication with the inlet of the condenser 7. Due to the liquid working medium within the first loop 31 in the regenerator 3, and the gas-liquid two-phase working medium in the second loop 32 that passes through the object under test, energy exchange would occur between the first loop 31 and the second loop 32, so that the temperature of the liquid working medium in the first loop 31 would increase and the temperature of the gas-liquid two-phase working medium in the second loop 32 would decrease. Due to the increase in the temperature of the liquid working medium in the first loop 31, the first regulating valve K1 can be regulated in use to connect or isolate the first loop 31 of the regenerator 3 according to the demand of the inlet liquid temperature of the object under test, and high-precision control for the inlet liquid temperature can be realized through the cooperation of the regenerator 3 and the preheater 4. Due to the increase in the temperature of the liquid working medium in the first loop 31, when the liquid working medium flowing through the first loop 31 merges with the liquid working medium flowing through the second regulating valve K2, the overall temperature of the merged liquid working medium rises, and at this time, the energy required for the preheater 4 to heat the liquid working medium to the target temperature decreases. Furthermore, due to the decrease in the temperature of the gas-liquid two-phase working medium flowing through the second loop 32, less energy is required for the condenser 7 to cool the gas-liquid two-phase working medium into liquid. The system for testing two-phase liquid cooling in this embodiment can realize accurate control of the inlet temperature of the working medium entering the object under test, while making full use of the residual heat of the working medium in gas-liquid two-phase state passing through the object under test, thus greatly reducing the energy loss of the system.

It should be noted that each of the first regulating valve K1, the second regulating valve K2, the liquid outlet valve K3 and the liquid inlet valve K5 can be selected from a manual regulating valve or an automatic regulating valve. In an embodiment, since the first regulating valve K1 and the second regulating valve K2 need to regulate the quantity of flow of the working medium in the pipelines connected the first and second regulating valves, manual regulating valves are adopted. The flow control in the two pipelines at the outlet of the power pump 2 is realized by slow regulation of the first regulating valve K1 and the second regulating valve K2 manually, so as to control the inlet liquid temperature more accurately. The liquid outlet valve K3 and the liquid inlet valve K5 can adopt automatic control to realize the open and shut functions as intended.

In some examples, as shown in FIG. 2, the first regulating valve K1 and the second regulating valve K2 in FIG. 1 can be integrated into a three-way valve. The three-way valve includes a valve a, a valve b, and a valve c. Valve c is connected to the outlet of the power pump 2. Valve a is connected to the pipeline branch connecting the regenerator 3. Valve b connects a branch through which the power pump 2 directly communicates with the preheater 4. The working medium flowing out from the power pump 2 is split in two ways at the three-way valve, one way of the working medium flows into the first loop 31 of the regenerator 3 through valve a, and the other way of the working medium flows into the preheater 4 through valve b.

In an example, as shown in FIGS. 1 and 2, in order to accurately measure and control the flow of the working medium in the system, the system for testing two-phase liquid cooling further includes a flowmeter 8, which is connected to the outlet of the power pump 2 for measuring the flow of the working medium in the system.

In an example, as shown in FIGS. 1 and 2, in order to accurately measure and control the temperature in the system, the system further includes a thermometer and a pressure gauge. Thermometers are arranged in the liquid storage tank 1, between the condenser 7 and the power pump 2, at the inlet of the preheater 4, at the outlet of the preheater 4, at the inlet of the second loop 32 of the regenerator 3 and at the water injection inlet of the condenser 7. Pressure gauges are arranged at the outlet of the preheater 4, and the inlet of the second loop 32 of the regenerator 3.

As shown in FIG. 1, the liquid storage tank 1 is provided with a first thermometer denoted as T0. The first thermometer T0 is configured to measure the temperature of the working medium in the liquid storage tank 1, and the measured temperature is denoted as T0. A second thermometer T1 is arranged between the condenser 7 and the power pump 2, and the measured temperature is denoted as T1. A third thermometer T2 is arranged at the inlet of the preheater 4, and the measured temperature is denoted as T2. It should be noted that when the first regulating valve K1 is shut and the second regulating valve K2 is opened, the temperature T2 measured by the third thermometer T2 here is the temperature of the liquid working medium flowing through the second regulating valve K2. When both the first regulating valve K1 and the second regulating valve K2 are opened, the temperature T2 measured by the third thermometer T2 here is the temperature of the merged working medium after the liquid working medium flowing through the first loop 31 and the liquid working medium flowing through the second regulating valve K2 are merged. A fourth thermometer T3 and a first pressure gauge P1 are arranged at the outlet of the preheater 4, the temperature measured by the fourth thermometer T3 is denoted as T3, and the pressure measured by the first pressure gauge P1 is denoted as P1. A fifth thermometer T4 and a second pressure gauge P2 are arranged at the inlet of the second loop 32 of the regenerator 3. The temperature measured by the fifth thermometer T4 is denoted as T4, and the pressure measured by the second pressure gauge P2 is denoted as P2. A sixth thermometer T5 is arranged at the water injection inlet of the condenser 7, and the temperature measured by the sixth thermometer T5 is denoted as T5.

It should be noted that in order to avoid the flow resistance test error caused by pipeline resistance, the branch pipelines near the first pressure gauge P1 and the second pressure gauge P2 are designed to reduce resistance, including but not limited to employing a liquid separator instead of a three-way liquid separator. The larger diameter of the liquid separator can greatly reduce the flow resistance.

In an example, the system for testing two-phase liquid cooling further includes a processor, which is connected to each of the thermometers and pressure gauges. The processor can obtain the measured values of these thermometers and pressure gauges, and show them to testers after processing the measured values. For example, the processor can be a computer, and after the computer obtains and processes these measured values, the processed measured values are displayed on the display screen of the computer, so that the tester can observe the temperature and pressure conditions at each corner in the pipelines of the system in real-time.

In some embodiments, the processor can be further connected with at least one of the flowmeter 8, the power pump 2, the liquid storage tank 1, or the preheater 4. When connecting the flowmeter 8, the processor can obtain and display the current flow of the working medium in the system. When the processor is connected with the power pump 2, the rotating speed of the power pump 2 can be automatically controlled. For example, the processor can be a computer, and the tester can input the target flow value into the computer, and then the rotating speed of the power pump 2 can be automatically controlled such that the flow in the system reaches the target flow value. When the processor is connected to the liquid storage tank 1, the temperature of the liquid storage tank 1 can be automatically controlled to regulate the pressure in the system, so that the working medium in the system can reach the target evaporation temperature. When the processor is connected with the preheater 4, the power of the preheater 4 can be automatically controlled to realize temperature elevation to different temperatures.

In another embodiment, as shown in FIG. 3, a plurality of liquid outlet ports 5, liquid inlet ports 6, liquid outlet valves (K3 and K4) and liquid inlet valves (K5 and K6) are provided. Each of the liquid outlet ports 5 corresponds to a respective one of the liquid inlet ports 6. The system for testing two-phase liquid cooling further includes a plurality of first branch pipelines, and a plurality of second branch pipelines. The preheater 4 is in communication with the liquid outlet ports 5 through the plurality of first branch pipelines, with each first branch pipeline correspondingly in communication with a respective liquid outlet port 5 through a respective liquid outlet valve K3 or K4. The inlet of the second loop 32 is in communication with the liquid inlet ports 6 through a plurality of second branch pipelines, with each second branch pipeline correspondingly in communication with a respective liquid inlet port 6 through a respective liquid inlet valve K5 or K6.

In particular, the term "plurality" means two or more. It is shown that two of the liquid outlet ports 5, the liquid inlet ports 6, the liquid outlet valves (K3 and K4) and the liquid inlet valves (K5 and K6) by way of a non-limiting example are shown in FIG. 3, but in practical employment, three or more of the ports and valves as mentioned above may be provided. In FIG. 3, each first branch pipeline is correspondingly in communication with a respective liquid outlet port 5 through a respective liquid outlet valve K3 or K4, and each second branch pipeline is correspondingly in communication with a respective liquid inlet port 6 through a respective liquid inlet valve K5 or K6. In this way, single-branch test and multi-branch test can be realized by controlling the switches of the plurality of liquid outlet valves (K3 and K4) and the plurality of liquid inlet valves (K5 and K6). During a single-branch test, the liquid outlet valve K3 and the liquid inlet valve K5 are opened, while the liquid outlet valve K4 and the liquid inlet valve K6 are shut. Alternatively, the liquid outlet valve K4 and the liquid inlet valve K6 are opened while the liquid outlet valve K3 and the liquid inlet valve K5 are shut. During a multi-branch test, the liquid outlet valve K3, the liquid outlet valve K4, the liquid inlet valve K5 and the liquid inlet valve K6 are opened. Multi-branch test allows the simulation of multi-branch operating conditions according to the application requirements of the object under test, and the observation of the flow and heat transfer features of the object under test under different application environments by controlling the quantity of flow, temperature and flow state.

As an implementation, as shown in FIGS. 1 and 2, when one liquid inlet port 6 and one liquid outlet port 5 are provided, the system for testing two-phase liquid cooling further includes two sight glasses 9. One sight glass is arranged between the liquid outlet valve K3 and the preheater 4, and the other one is arranged between the liquid inlet valve K5 and the regenerator 3. Each of the sight glass 9 is configured to allow the observation of the flow state of the working medium before the working medium enters the object under test and after the working medium flows out from the object under test, so as to comprehensively analyze the heat transfer feature and flow feature of the working medium.

As another implementation, as shown in FIG. 3, when a plurality of liquid outlet ports 5, liquid inlet ports 6, liquid outlet valves (K3 and K4) and liquid inlet valves (K5 and K6) are provided, the system for testing two-phase liquid cooling further includes a plurality of sight glasses 9. Each first branch pipeline is provided with a sight glass 9 between the liquid outlet valve K3 and the preheater 4. Each second branch pipeline is provided with a sight glass 9 between the liquid inlet valve K5 and the regenerator 3, so that the flow state of the working medium in each branch pipeline can be observed.

In an example, the system for testing two-phase liquid cooling further includes a gas outlet valve and a vacuum pump. The vacuum pump communicates with the pipeline between the liquid inlet valve and the liquid outlet valve through the gas outlet valve, and the vacuum pump is configured to pump the gas out from the system.

As shown in FIG. 4, when one liquid outlet port 5, one liquid inlet port 6, one liquid outlet valve K3 and one liquid inlet valve K5 are provided, a branch can be branched along the pipeline between the liquid outlet port 5 and the liquid outlet valve K3 to communicate with the vacuum pump 10, and the gas outlet valve K7 is arranged on the branch.

As shown in FIG. 5, when a plurality of liquid outlet ports 5, liquid inlet ports 6, liquid outlet valves (K3 and K4) and liquid inlet valves (K5 and K6) are provided, a branch can be branched along the pipeline between each liquid outlet port 5 and a respective liquid outlet valve (K3 or K4) to communicate with the vacuum pump 10, and each branch is provided with a gas outlet valve K7 or a gas outlet valve K8.

For example, when the object under test is being replaced with a new one, due to the gas in the new object under test, in order to prevent the gas in the new object under test from entering the whole system, the following operations can be performed to exhaust the gas in the new object under test from the system. The operations are illustrated with reference to FIG. 5 where two liquid outlet valves (K3 and K4) and two liquid inlet valves (K5 and K6) are shown by way of an example. Operation (1), the liquid outlet valve K3, the liquid outlet valve K4, the liquid inlet valve K5 and the liquid inlet valve K6 are shut. Operation (2), the object under test is replaced with a new one mounted between the liquid inlet port 6 and the liquid outlet port 5. Operation (3), the gas outlet valve K7 and the gas outlet valve K8 are opened, and the vacuum pump 10 is turned on for vacuuming. Operation (4), the vacuum pump 10 is turned off after the vacuuming is done, and the gas outlet valve K7 and the gas outlet valve K8 are shut, such that the replacement of the object under test is done. After that, single-branch and/or multi-branch test can be carried out according to the test requirements of the new object under test.

In some examples, as shown in FIGS. 1 to 5, the system for testing two-phase liquid cooling further includes a recycling/filling port 11 arranged along the pipeline between the condenser 7 and the power pump 2, and the recycling/filling port 11 is configured to recycle the working medium in the system, or fill the working medium into the system. Since the working medium applied to different objects under test may be different during testing, it is necessary to replace the working medium in the system through the recycle/filling port 11. However, when pumping the working medium from the system, it is inevitable that gas will enter the system, so the cooperation of the vacuum pump 10 is needed to pump the gas from the system. It should be noted that the working medium of the system needs to be replaced before the object under test is replaced, so as to avoid the initial working medium in the system from polluting the new object under test. And after the working medium in the system is pumped, each component and pipeline in the system can be maintained.

The following is an example illustrated with reference to FIG. 5. Operation (1), all valves except the gas outlet valve K7 and gas outlet valve K8 are opened. Operation (2), the working medium is recycled through the recycle/filling port 11. Operation (3), the gas outlet valve K7 and the gas outlet valve K8 are opened, and the vacuum pump 10 is turned on for vacuuming. Operation (4), the gas outlet valve K7 and the gas outlet valve K8 are shut, and the vacuum pump 10 is turned off after the vacuuming is done. Operation (5), a new working medium is filled through the recycle/filling port 11.

The design of the gas outlet valve K7, the gas outlet valve K8 and the vacuum pump 10 can realize partial vacuum pumping and the whole system vacuum pumping. The integrated design of the gas outlet valve K7, the gas outlet valve K8, the vacuum pump 10 and the recycle/filling port 11 can realize the functions of filling the working medium and maintaining the components in the system, and improve the operability and maintainability of the system.

Figure 6:
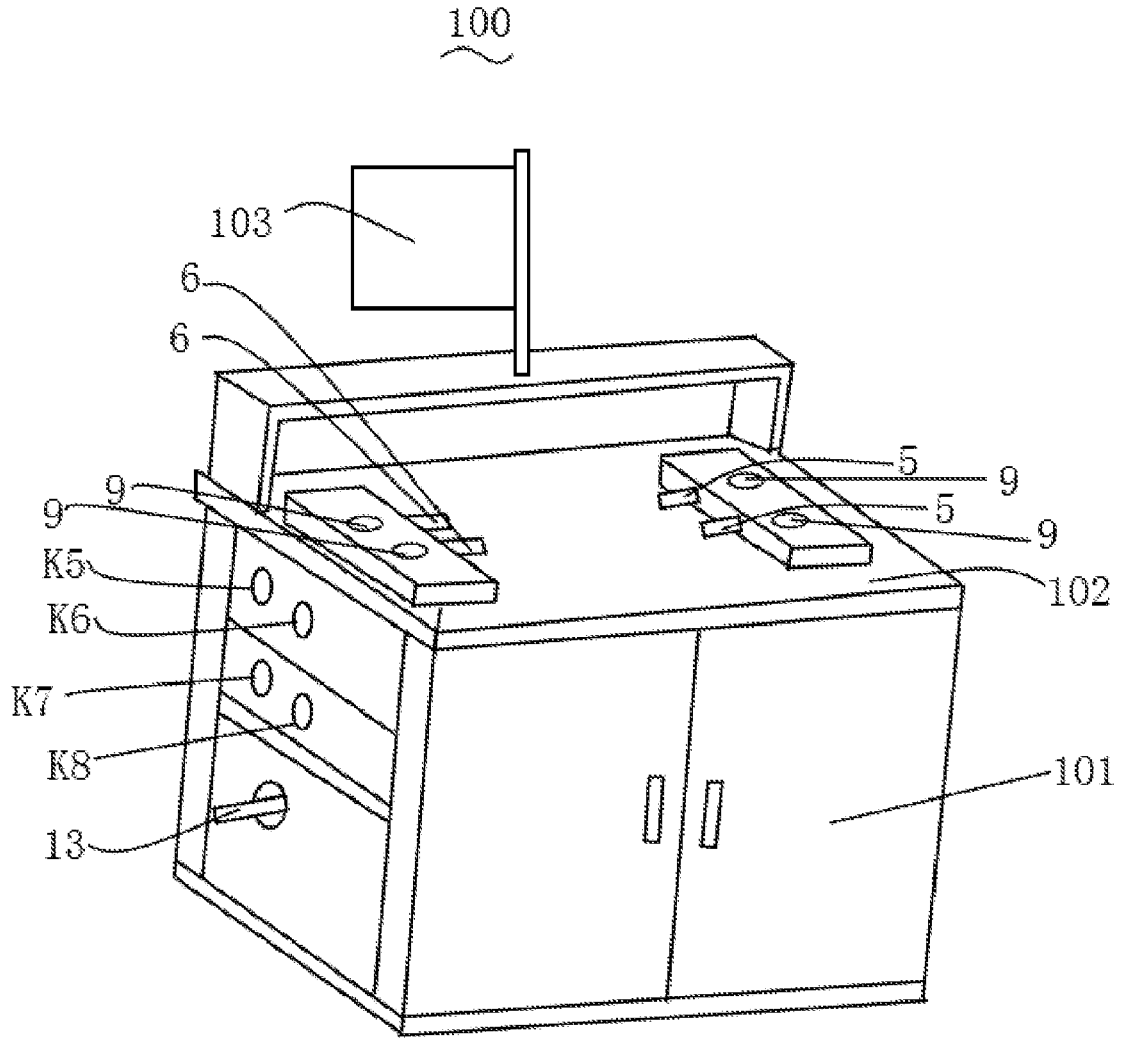
FIG. 6 depicts a schematic diagram showing a left side view of the system for testing two-phase liquid cooling integrated into the cabinet body according to an embodiment of the present disclosure.
Figure 7:
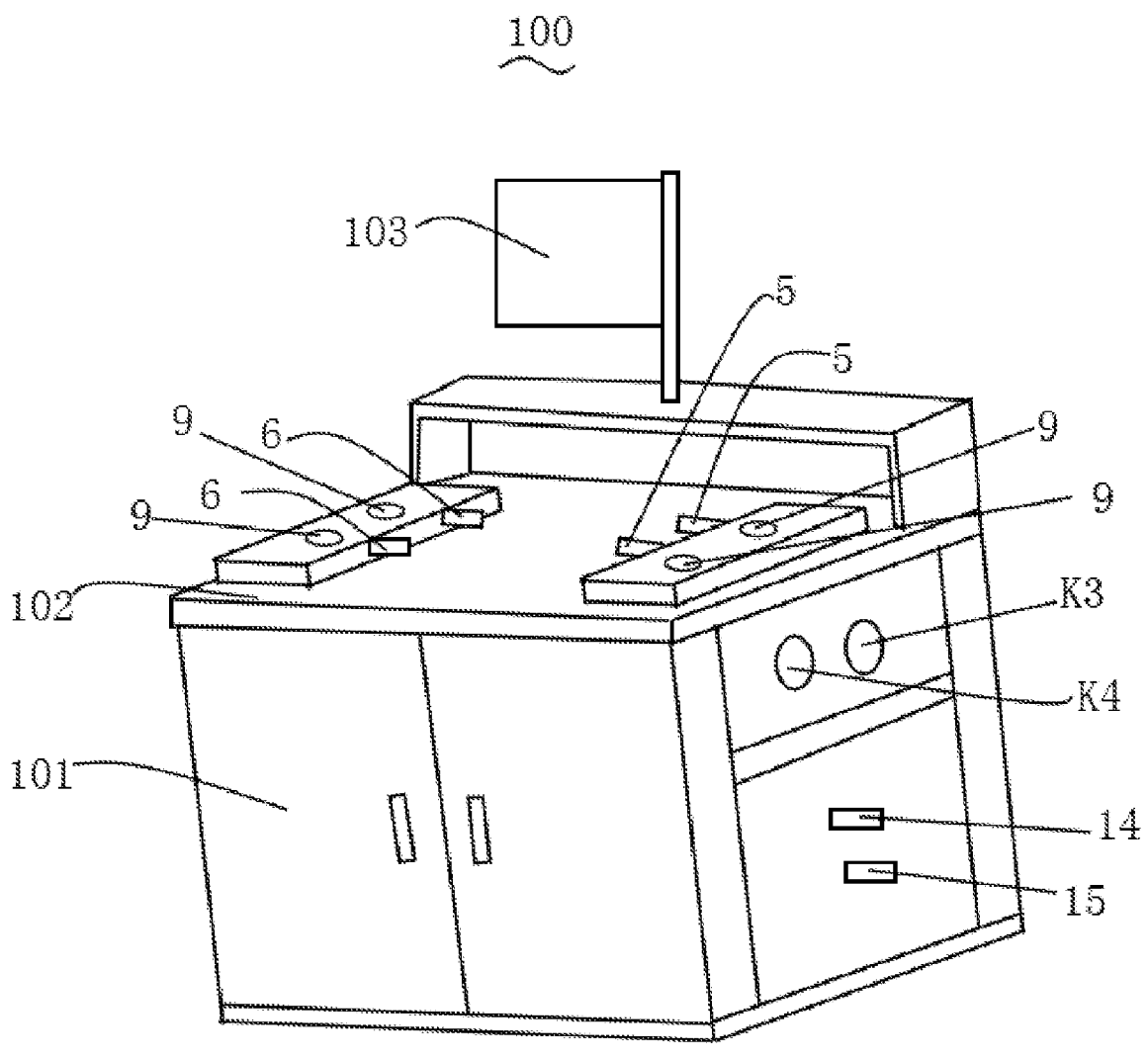
FIG. 7 depicts a schematic diagram showing a right side view of the system for testing two-phase liquid cooling integrated into the cabinet body according to an embodiment of the present disclosure.

In an embodiment, as shown in FIGS. 6 and 7, the system for testing two-phase liquid cooling further includes an operation cabinet 100. The operation cabinet 100 includes a cabinet body 101 and a worktop 102 arranged above the cabinet body 101. The liquid storage tank 1, the power pump 2, the regenerator 3, the preheater 4 and the condenser 7 (not shown in FIGS. 6 and 7) are accommodated in the cabinet body 101. The liquid outlet port 5 and the liquid inlet port 6 are arranged on the worktop 102. The first regulating valve K1, the second regulating valve K2, the liquid inlet valves (K5 and K6) and the liquid outlet valves (K3 and K4) are arranged on an outer side of the cabinet body 101. In this embodiment, the system for testing two-phase liquid cooling is entirely integrated into the operation cabinet 100, and rollers (not shown in FIGS. 6 and 7) can be arranged below the operation cabinet 100 to facilitate the displacement of the whole system for testing two-phase liquid cooling.

In the following, the whole operation cabinet 100 will be described with two liquid outlet valves (K3 and K4) and two liquid inlet valves (K5 and K6). The cabinet body 101 internally accommodates the liquid storage tank 1, the power pump 2, the regenerator 3, the preheater 4, the condenser 7, the vacuum pump 10 and the recycle/filling port 11. When the door of the cabinet body 101 is opened, all the components accommodated in the cabinet body 101, the pipelines connecting the components, and a plurality of thermometers and pressure gauges arranged on the pipelines can be seen. A worktop 102 is provided above the cabinet body 101. A liquid outlet port 5 and a liquid inlet port 6 which are opposite to each other, are arranged on the worktop 102. Further arranged on the worktop 12 is a sight glass 9. An object under test can be placed onto the worktop 12 for testing. The liquid outlet valves (K3 and K4) can be arranged on an outer side of the cabinet body 101 and near the liquid outlet port 5. The liquid inlet valves (K5 and K6) can be arranged on an outer side of the cabinet body 101 and near the liquid inlet port 6. The gas outlet valve K7 and the gas outlet valve K8 can also be arranged on an outer side of the cabinet body 101. The gas outlet 12 of the vacuum pump 10 and the cold water inlet 1 and cold water outlet 14 of the condenser 7 are also arranged on an outer side of the cabinet body 101. It should be noted that the above valves can also be arranged within the cabinet body 101, but for the convenience of manual control, they are designed to be placed on an outer side of the cabinet body 101.

The operation cabinet 100 can be further integrated with a processor. A display screen 103 is arranged overhead above the worktop 102 to display the values measured by thermometers and pressure gauges at various positions in the system, which is convenient for testers to use.

In some embodiments, as shown in FIG. 8, the system for testing two-phase liquid cooling further includes a heater 12 arranged in the liquid storage tank 1, and the heater 12 is configured to heat the working medium in the liquid storage tank 1. The system for testing two-phase liquid cooling further includes a spray loop having an end connected to the outlet end of the pump and the other end connected to the inlet of the liquid storage tank 1. The spray loop is also provided with an electromagnetic valve K10. When it is necessary to cool the liquid storage tank, the electromagnetic valve K10 can be opened to cool the working medium in the liquid storage tank.

In other examples, a heating table can be arranged below the object under test as needed to further heat the working medium in the object under test.

The system for testing two-phase liquid cooling in the embodiments and examples described above can realize the following tests.

(1) Single-branch test. According to the requirements of the product application environment, the flow resistance and thermal resistance of the object under test, such as a cold plate, a quick break, a pipeline, or the like, are required to be tested under the specified quantity of flow, evaporation temperature, inlet liquid subcooled degree and dryness, and various parameters should be controlled accurately and stably.

(2) Multi-branch test. Multi-branch operating conditions are simulated according to the application requirements of the object under test, and the flow and heat transfer features of the object under test under different application environments by controlling and recording data like the quantity of flow, temperature, and flow state.

(3) Replacement of object under test. The flow and heat transfer features of different objects under test are tested in turn and compared horizontally, and the objects under test can be replaced quickly.

(4) Performance test of the working medium. The working medium of the system is replaceable.

(5) Fluid refill. After long-term testing, the system can be subjected to fluid refill.

(6) Maintenance of components, such as the power pump.

(7) The test operability is good, the parameters can be controlled through the touch screen, and the common valves are easy to operate.

The system for testing two-phase liquid cooling in the embodiments and examples described above can realize the following functions and effects.

(1) Each parameter can be accurately and independently controlled, so that the influence of each parameter on two-phase flow and heat transfer can be discussed through testing.

(2) Multi-branch universal interface design can cover different types of objects under test and different test conditions.

(3) The functions of local vacuum pumping, system vacuum pumping, system filling and component maintenance are integrated, and the system has good operability and high test efficiency.

(4) Regeneration and preheat functions can be reasonably utilized according to the test conditions, and combined with the stable control of pre-pump subcooled degree, the energy consumption of the system is low and energy is saved.

(5) The touch screen can be utilized to switch between automatic and manual control modes, and at the same time, the test efficiency and stability are improved.

Figure 9:
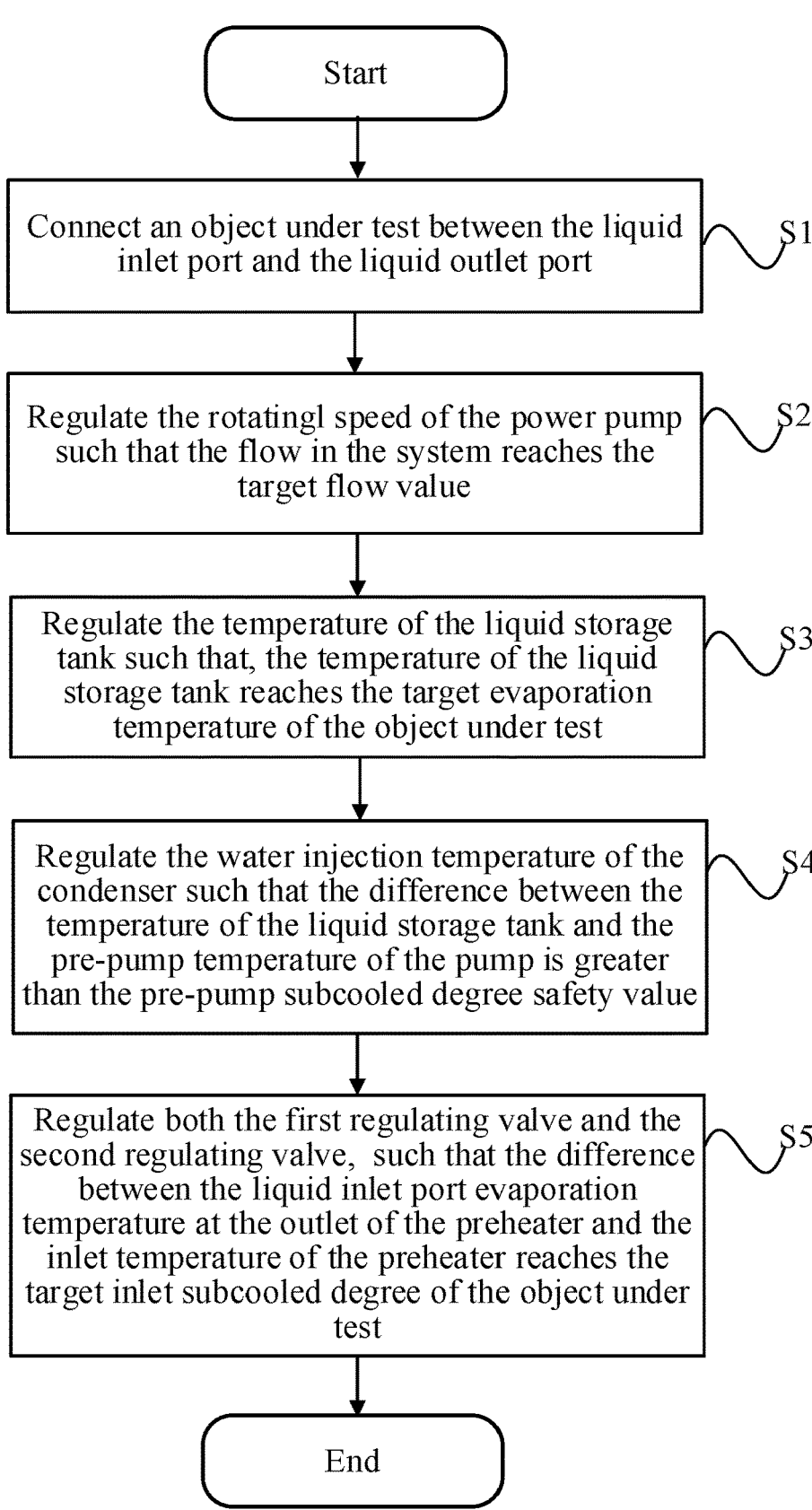
FIG. 9 depicts a flow chart showing a method for testing two-phase liquid cooling according to an embodiment of the present disclosure.

In another embodiment, it relates to a method for testing two-phase liquid cooling, which is applied to the system for testing two-phase liquid cooling shown in FIGS. 1 to 7. As shown in FIG. 9, the method includes the following operations.

At operation S1, an object under test is connected between the liquid inlet port 6 and the liquid outlet port 5.

At operation S2, the rotating speed of the power pump 2 is regulated such that the flow in the system reaches the target flow value.

At operation S3, the temperature of the liquid storage tank 1 is regulated such that, the temperature of the liquid storage tank 1 reaches the target evaporation temperature of the object under test.

At operation S4, the water injection temperature of the condenser 7 is regulated such that the difference between the temperature of the liquid storage tank 1 and the pre-pump temperature of the power pump 2 is greater than the pre-pump subcooled degree safety value.

At operation S5, the first regulating valve K1 and the second regulating valve K2 are regulated so that the difference between the liquid inlet port evaporation temperature at the outlet of the preheater 4 and the inlet temperature of the preheater 4 reaches the target inlet liquid subcooled degree of the object under test.

In the above operation S2, when performing flow control, it is assumed that the target flow value of the system is $Q_{target}$, and the system automatically feeds back and regulates the rotating speed of the power pump 2 according to the flow value Q detected by the flowmeter 8. When $|Q_{target}-Q| \leq \Delta Q$, where $\Delta Q$ is an acceptable error for automatic regulation, the automatic regulation of the power pump 2 is stopped and the rotating speed of the power pump 2 is manually regulated to the target flow value. Each of the speed, accuracy and stability of flow control can be ensured by accurately controlling the test flow through automatic frequency conversion and manual frequency regulation of the power pump 2.

In the above operation S3, when the target evaporation temperature of the object under test is being regulated, it is assumed that the target evaporation temperature of the object under test is $T_{target}$, the temperature of working medium measured by the first thermometer T1 in the liquid storage tank 1 is T0, the liquid inlet pressure of the working medium flowing into the object under test measured by the first pressure gauge P1 arranged at the outlet of the preheater

4 is P1, and the liquid outlet pressure of the working medium flowing out from the object under test measured by the second pressure gauge P2 arranged at the inlet of the second loop 32 of the regenerator 3 is P2.

The scheme for regulation is as follows.

(1) The liquid inlet pressure P1 and the liquid outlet pressure P2 are acquired, the corresponding liquid inlet evaporation temperature T10 is automatically calculated according to the liquid inlet pressure P1, the corresponding liquid outlet evaporation temperature T20 is automatically calculated according to the liquid outlet pressure P2, so as to calculate the evaporation temperature $T_{evaporation}$ of the current system=(T10+T20)/2.

(2) When $T_{target}-T_{evaporation}>\Delta$ T1 ($\Delta$ T1 is a control precision), the heater 12 on the liquid storage tank 1 is turned on to heat the working medium in the liquid storage tank 1; when $0<T_{target}-T_{evaporation}<\Delta$ T1, it indicates that the evaporation temperature $T_{evaporation}$ of the current system is close to $T_{target}$, and the heater 12 can be turned off. When $T_{evaporation}-T_{target}>\Delta$ T1, the electromagnetic valve K10 of the spray branch on the liquid storage tank 1 is turned on to cool the working medium in the liquid storage tank 1; when $0<T_{evaporation}-T_{target}<\Delta$ T1, it indicates that the evaporation temperature $T_{evaporation}$ of the current system is close to $T_{target}$, and the spray branch can be deactivated.

In the above operation S4, in order to protect the safe operation of the power pump 2 and reduce the power consumption and ensure the energy-saving effect of the preheater 4, it is necessary to control the difference between the temperature of the liquid storage tank 1 and the pre-pump temperature of the power pump 2 to be greater than the pre-pump subcooled degree safety value. Assuming that the pre-pump subcooled degree safety value is $\Delta$T2, it is necessary to ensure that T0−T1>$\Delta$T2. Due to the control error $\Delta$T3, during practical testing and when T0−T1<$\Delta$T2− $\Delta$T3, the water injection temperature T5 of the condenser 7 is reduced. When T0−T1≥$\Delta$T2−$\Delta$T3, the water injection temperature T5 of the condenser 7 is maintained unchanged.

In the above operation S5, it is necessary to regulate the regenerator 3 and the preheater 4, so that the difference between the liquid inlet port evaporation temperature at the outlet of the preheater 4 and the inlet temperature of the preheater 4 reaches the target inlet liquid subcooled degree of the object under test, and the difference between the liquid inlet port evaporation temperature at the outlet of the pre-heater 4 and the inlet temperature of the preheater 4 is the current inlet liquid subcooled degree of the system. Assuming that the target inlet liquid subcooled degree of the object under test is $T_{subcooled}$, the scheme for regulation is as follows.

(1) When T10−T2<$T_{subcooled}-\Delta$T4 ($\Delta$T4 is a control precision), the first regulating valve K1 is closed and the second regulating valve K2 is opened; on this basis, if T10− T2<$T_{subcooled}-\Delta$T4, the water injection temperature T5 of the condenser 7 is controlled to decrease until T10− T2≥$T_{subcooled}-\Delta$ T4.

(2) When T10−T2>$T_{subcooled}+\Delta$T4, the first regulating valve K1 and the second regulating valve K2 are regulated until $T_{subcooled}-\Delta$ T4≤T10−T2≤$T_{subcooled}+\Delta$ T4; and if the first regulating valve K1 is completely opened and the second regulating valve K2 is completely closed, and T10− T2>$T_{subcooled}+\Delta$T4 in such a case, then the scheme proceeds to operation (3).

(3) The processor automatically calculates the additional power consumption according to the inlet liquid subcooled degree, T10−T2, the target inlet liquid subcooled degree $T_{subcooled}$, and the flow of the working medium, and physical properties for the current object under test, and automatically controls the power of the preheater 4: $P=\gamma*Q*(T10-T2-T_{subcooled})$, where Q is the flow of the working medium in the current system, and $\gamma$ is a constant.

The method for two-phase liquid cooling according to this embodiment accurately controls the evaporation temperature of the object under test by automatically/manually controlling the temperature of the liquid storage tank 1. And through the automatic/manual control of the water injection temperature of the condenser 7, the influence of unevenness of gas-liquid heat exchange is reduced, so that the pre-pump subcooled degree is accurately controlled. The regenerator 3 is connected or isolated according to the requirement of inlet liquid subcooled degree, the power consumption of the preheater 4 is automatically regulated, the inlet liquid temperature is accurately controlled, and energy loss is reduced.

In summary, the system and method for testing two-phase liquid cooling can accurately and independently control the quantity of flow, dryness, evaporation temperature, liquid inlet temperature, and inlet liquid subcooled degree of the object under test, accurately measure the thermal resistance and flow resistance parameters of the object under test, and improve the precision, efficiency and scope of two-phase test.

It is clear that this embodiment is a method embodiment corresponding to the system embodiment as described above, and this embodiment may be implemented in cooperation with the system embodiment. The related technical details described in the embodiment(s) above are still applicable to this embodiment, so which will not be repeated here in order to reduce redundancy. Accordingly, the relevant technical details as described in this embodiment can also be applied to the system embodiment(s) above.

It shall be understood by those having ordinary skill in the art that the above are some embodiments for implementing the present disclosure, and in practical application, various alternations in form and details can be made without departing from the scope of the present disclosure.

What is claimed is:

1. A system for testing two-phase liquid cooling, comprising, a liquid storage tank configured to store a working medium;

a power pump having an inlet in communication with an outlet of the liquid storage tank;

a regenerator and a first regulating valve; wherein the regenerator comprises a first loop having an inlet in communication with an outlet of the power pump through the first regulating valve, and the power pump is configured to convey the working medium to the first loop;

a preheater and a second regulating valve; wherein an inlet of the preheater is in communication with an outlet of the first loop, and the inlet of the preheater is further in communication with the outlet of the power pump through the second regulating valve;

a liquid outlet port and a liquid outlet valve; wherein the liquid outlet port is configured to communicate with an object under test, and the liquid outlet port is in communication with the preheater through the liquid outlet valve;

a liquid inlet port and a liquid inlet valve; wherein the regenerator further comprises a second loop having an inlet in communication with the liquid inlet port through the liquid inlet valve, and energy exchange is allowed between the first loop and the second loop in the regenerator; and a condenser having an inlet in communication with an outlet of the second loop; wherein the condenser is configured to cool the working medium passing through the object under test, and an outlet of the condenser is in communication with both the inlet of the power pump and the outlet of the liquid storage tank.

2. The system according to claim 1, wherein a plurality of liquid outlet ports, a plurality of liquid inlet ports, a plurality of liquid outlet valves, and a plurality of liquid inlet valves are provided;

the liquid outlet port is one of the plurality of liquid outlet ports, the liquid inlet port is one of the plurality of liquid inlet ports, the liquid outlet valve is one of the plurality of liquid outlet valves, and the liquid inlet valve is one of the plurality of liquid inlet valves;

each of the plurality of liquid outlet ports corresponds to a respective one of the plurality of liquid inlet ports;

the system further comprises a plurality of first branch pipelines, and a plurality of second branch pipelines;

the preheater is in communication with the liquid outlet ports through the first branch pipelines, and each first branch pipeline is correspondingly in communication with one of the liquid outlet ports through one of the liquid outlet valves; and the inlet of the second loop is in communication with the plurality liquid inlet ports through the second branch pipelines, and each second branch pipeline is correspondingly in communication with one of the liquid inlet ports through one of the liquid inlet valves.

3. The system according to claim 2, further comprising a plurality of sight glasses; wherein each first branch pipeline is provided with one sight glass of the plurality of sight glasses, and the sight glass in each first branch pipeline is arranged between a respective one of the plurality of liquid outlet valves and the preheater; and each second branch pipeline is provided with one sight glass of the plurality of sight glasses, and the sight glass in each second branch pipeline is arranged between a respective one of the plurality of liquid inlet valves and the regenerator.

4. The system according to claim 3, further comprising a flowmeter; wherein the flowmeter is connected to the outlet of the power pump, and is configured to measure a quantity of flow of the working medium within the system.

5. The system according to claim 3, further comprising a plurality of thermometers, and a plurality of pressure gauges; wherein each of the plurality of thermometers is respectively arranged in one of following positions, the liquid storage tank, between the condenser and the power pump, at the inlet of the preheater, at the outlet of the preheater, at the inlet of the second loop of the regenerator, or at a water injection inlet of the condenser; and each of the plurality of pressure gauges is respectively arranged in one of following positions, at the outlet of the preheater, or at the inlet of the second loop of the regenerator.

6. The system according to claim 2, further comprising a flowmeter; wherein the flowmeter is connected to the outlet of the power pump, and is configured to measure a quantity of flow of the working medium within the system.

7. The system according to claim 2, further comprising a plurality of thermometers, and a plurality of pressure gauges; wherein each of the plurality of thermometers is respectively arranged in one of following positions, the liquid storage tank, between the condenser and the power pump, at the inlet of the preheater, at the outlet of the preheater, at the inlet of the second loop of the regenerator, or at a water injection inlet of the condenser; and each of the plurality of pressure gauges is respectively arranged in one of following positions, at the outlet of the preheater, or at the inlet of the second loop of the regenerator.

8. The system according to claim 1, wherein further comprising a gas outlet valve, and a vacuum pump; wherein the vacuum pump is in communication with a pipeline between the liquid inlet valve and the liquid outlet valve through the gas outlet valve, and the vacuum pump is configured to pump out a gas within the system.

9. The system according to claim 8, further comprising a flowmeter; wherein the flowmeter is connected to the outlet of the power pump, and is configured to measure a quantity of flow of the working medium within the system.

10. The system according to claim 8, further comprising a plurality of thermometers, and a plurality of pressure gauges; wherein each of the plurality of thermometers is respectively arranged in one of following positions, the liquid storage tank, between the condenser and the power pump, at the inlet of the preheater, at the outlet of the preheater, at the inlet of the second loop of the regenerator, or at a water injection inlet of the condenser; and each of the plurality of pressure gauges is respectively arranged in one of following positions, at the outlet of the preheater, or at the inlet of the second loop of the regenerator.

11. The system according to claim 1, further comprising a recycling/filling port arranged along a pipeline between the condenser and the power pump, and the recycling/filling port is configured to recycle the working medium in the system, or fill the working medium into the system.

12. The system according to claim 11, further comprising a flowmeter; wherein the flowmeter is connected to the outlet of the power pump, and is configured to measure a quantity of flow of the working medium within the system.

13. The system according to claim 11, further comprising a plurality of thermometers, and a plurality of pressure gauges; wherein each of the plurality of thermometers is respectively arranged in one of following positions, the liquid storage tank, between the condenser and the power pump, at the inlet of the preheater, at the outlet of the preheater, at the inlet of the second loop of the regenerator, or at a water injection inlet of the condenser; and each of the plurality of pressure gauges is respectively arranged in one of following positions, at the outlet of the preheater, or at the inlet of the second loop of the regenerator.

14. The system according to claim 1, further comprising a flowmeter; wherein the flowmeter is connected to the outlet of the power pump, and is configured to measure a quantity of flow of the working medium within the system.

15. The system according to claim 1, further comprising a plurality of thermometers, and a plurality of pressure gauges; wherein each of the plurality of thermometers is respectively arranged in one of following positions, the liquid storage tank, between the condenser and the power pump, at the inlet of the preheater, at the outlet of the preheater, at the inlet of the second loop of the regenerator, or at a water injection inlet of the condenser; and each of the plurality of pressure gauges is respectively arranged in one of following positions, at the outlet of the preheater, or at the inlet of the second loop of the regenerator.

16. The system according to claim 15, further comprising a processor; wherein the processor is connected with each of the plurality of thermometers and each of the plurality of pressure gauges.

17. The system according to claim 1, further comprising an operation cabinet; wherein the operation cabinet comprises a cabinet body, and a worktop arranged above the cabinet body;

each of the liquid storage tank, the power pump, the regenerator, the preheater and the condenser are accommodated in the cabinet body, and each of the liquid outlet port and the liquid inlet port is arranged on the worktop; and each of the first regulating valve, the second regulating valve, the liquid inlet valve and the liquid outlet valve is arranged on an outer side of the cabinet body.

18. A method for testing two-phase liquid cooling, which is applied to the system as claimed in claim 1;

the method comprising, connecting the object under test between the liquid inlet port and the liquid outlet port;

regulating a rotating speed of the power pump, such that a flow in the system reaches a target flow;

regulating a temperature of the liquid storage tank, such that a temperature of the liquid storage tank reaches a target evaporation temperature of the object under test;

regulating a water injection temperature of the condenser, such that a difference between the temperature of the liquid storage tank and a pre-pump temperature of the power pump is greater than a pre-pump subcooled degree safety value; and regulating both the first regulating valve and the second regulating valve, such that a difference between a liquid inlet port evaporation temperature at the outlet of the preheater and a temperature at the inlet of the preheater reaches a target inlet liquid subcooled degree of the object under test.

* * * * *